US007001675B2

(12) United States Patent
Chan

(10) Patent No.: US 7,001,675 B2
(45) Date of Patent: Feb. 21, 2006

(54) METHOD OF FORMING A NANOCOMPOSITE COATING

(75) Inventor: Winston Siu Yeung Chan, Hong Kong (HK)

(73) Assignee: Winsky Technology Ltd., Hong Kong (CN)

( * ) Notice: Subject to any disclaimer, the term of this patent is extended or adjusted under 35 U.S.C. 154(b) by 134 days.

(21) Appl. No.: 10/453,656

(22) Filed: Jun. 4, 2003

(65) Prior Publication Data

US 2006/0008669 A1 Jan. 12, 2006

(51) Int. Cl.
*B32B 15/00* (2006.01)
*B32B 15/04* (2006.01)
*C23C 14/16* (2006.01)
*C23C 14/34* (2006.01)

(52) U.S. Cl. ..................... 428/685; 428/627; 428/698; 428/472; 204/192.16; 204/298.13; 204/298.28; 427/405; 427/249; 427/251; 427/255.5; 427/255.7

(58) Field of Classification Search ................ 428/685, 428/938, 660, 662, 687, 472, 698, 627; 204/192.16, 204/298.13, 298.28; 427/405, 249, 251, 427/255.5, 255.7
See application file for complete search history.

(56) References Cited

U.S. PATENT DOCUMENTS

| | | | | |
|---|---|---|---|---|
| 3,537,846 A | * | 11/1970 | Jansson et al. | ............... 420/43 |
| 4,557,981 A | * | 12/1985 | Bergmann | .................. 428/627 |
| 5,192,409 A | * | 3/1993 | Tosa et al. | ............. 204/192.16 |
| 5,352,493 A | | 10/1994 | Dorfman et al. | |
| 6,723,279 B1 | * | 4/2004 | Withers et al. | ............... 419/27 |
| 2003/0143402 A1 | * | 7/2003 | Hon et al. | .................. 428/408 |

FOREIGN PATENT DOCUMENTS

| | | |
|---|---|---|
| EP | 0856592 | 8/1998 |
| JP | 59-083767 | 5/1984 |
| JP | 60-229717 | * 11/1985 |
| JP | 61-238953 | 10/1986 |
| WO | WO 94/25641 | 11/1994 |
| WO | WO 96/39943 | 12/1996 |

OTHER PUBLICATIONS

Webster's New Collegiate Dictionary, 1977, "composite", p. 231.*
Veprek et al., "Superhard nanocomposite coatings. From basic science toward industrialization", Pure Appl. Chem., vol. 74, No. 3, pp. 475-481, 2002 IUPAC.
Zhang et al, "Recent advances of superhard nanocomposite coatings: a review", Surface and Coatings Technology 167 (2003) pp. 113-119.

* cited by examiner

*Primary Examiner*—John J. Zimmerman
(74) *Attorney, Agent, or Firm*—Buchanan Ingersoll PC

(57) ABSTRACT

There is disclosed a method of depositing a nanocomposite coating of stainless steel and a metallic carbide or metallic nitride, e.g. chromium carbide or chromium nitride, onto a stainless steel substrate 10, including the steps of (a) providing the stainless steel substrate 10; (b) depositing stainless steel on the substrate 10; (c) depositing chromium carbide or chromium nitride on the substrate 10; and allowing a nanocomposite coating 14 of the stainless steel and chromium carbide or chromium nitride to form on the substrate 10.

21 Claims, 4 Drawing Sheets

METHOD OF FORMING A NANOCOMPOSITE COATING

This invention relates to a method of coating or depositing a layer of stainless steel nanocomposite coating onto a substrate, in particular a solid metal or metal alloys substrate, and an article so coated.

BACKGROUND OF THE INVENTION

Stainless steel is used in a large number of applications and industries, including such wearable, ornamental or portable items as watch cases, watch bracelets, bracelets, eyeglass frames, jewelry items, and mobile phones. For aesthetic reasons, various surface finishes, such as polished, satin, and sand-blasted, are employed.

Stainless steel is usually of a hardness of 200 HV under the Vicker scale. As a result of this relatively low degree of hardness, stainless steel surfaces are easily scratched or otherwise damaged in daily use. The appearance and attractiveness of the aforesaid items, in particular watch cases and watch bracelets, will be blemished, thus affecting the value of such products.

Various methods have thus been devised for treating stainless steel to increase its hardness, including, e.g. nitridation and carburization. In nitridation, the surface of the stainless steel is hardened by formation of nitrides. Nitrogen is introduced into the stainless steel usually by heating the stainless steel in gaseous ammonia. In carburization, the outer layer of low-carbon stainless steel is converted into high-carbon stainless steel by contact with a carbonaceous material. Both nitridation and carburization can considerably increase the surface hardness of stainless steel. By carburization, the surface hardness of the treated stainless steel can reach around 800 HV; whereas by nitridation, a surface hardness of around 600 HV can be reached. Both processes, however, require high temperature treatments for a long period of time. For example, nitridation has to be carried out at a temperature of 524–549° C., and takes from 24 to 48 hours to complete the process. For carburization, the temperature is even higher, to the degree of 1,000° C., and takes about 20 hours to complete the process.

Both nitridation and carburization are based on the principle of solid diffusion, in which atoms of impurities, such as nitrogen and carbon, diffuse from the stainless steel surface into the interior of the bulk substrate. The diffusion concentration profile is gradual, and the depth of diffusion is usually between 20–30 microns. Improved hardness of the treated stainless steel is brought about by the formation of chromium nitride in the case of nitrided stainless steel, and chromium carbide in the case of carburized stainless steel. The degree of hardness is the highest at the surface of the treated stainless steel, where the concentration of the chromium nitride or chromium carbide is the highest, and decreases as the depth into the interior of the bulk substrate increases.

As discussed above, long treatment time and high treatment temperature are required for nitridation and carburization, thus decreasing throughput and production efficiency, and increasing the production cost. In addition, nitridation and carburization processes are also associated with the following drawbacks. Firstly, hardness and wear-resistance of the treated stainless steel are obtained at the expense of corrosion resistance. As there is no fresh supply of chromium, the formation of chromium nitride or chromium carbide will deplete the chromium content in the original stainless steel grain, thus adversely affecting the corrosion resistance capability of the treated stainless steel.

Secondly, nitridation and carburization can take place only on austenite stainless steel substrates, which are with high original chromium concentration, but not on martensite stainless steel substrates.

Thirdly, in order to enhance the efficiency of diffusion, the surface concentration of either nitrogen or carbon in the treated stainless steel is rather high, thus darkening or blemishing the surface of the treated stainless steel. Post-diffusion surface treatment, e.g. polishing, is thus required to return as much as possible the surface of the treated stainless steel to the original colour. Such treatment is usually performed manually, thus lacking control and consistency.

Another method of hardening stainless steel surface is by electroplating thereon relatively thick, e.g. over 10 microns, layers of chromium or tungsten. However, the surface colour of the so-treated stainless steel will also be very different from that of usual stainless steel. The hardness of the electroplated stainless steel is also lower than that of nitrided or carburized stainless steel. Carbides of chromium and tungsten can also be deposited on stainless steel substrates by physical vapor deposition, resulting in high hardness of the surface of the treated substrates. However, again, the surface colour of the so-treated stainless steel differs appreciably from that of usual stainless steel, thus hindering the mass acceptance of products made of such treated stainless steel in the market.

In addition, for such metals and metal alloys as copper, copper alloys, aluminum, aluminum alloys, magnesium, magnesium alloys, titanium, and titanium alloys, as there is little or no chromium, neither nitridation nor carburization of substrates made of such material is possible. Metallic hard chromium electroplating is only possible for application on copper and its alloys. Aluminum and its alloys, magnesium and its alloys, and titanium and its alloys oxidize rapidly in electrolytic solutions, and become electrically un-conductive, thus preventing electroplating. Although coating of various carbides and nitrides of high hardness can be deposited on these substances by physical vapor deposition (PVD), the appearance of such carbide or nitride coatings are very different from stainless steel. Furthermore, PVD of ceramics such as carbide or nitride uses radio frequency (RF) power supplies, e.g. at a frequency of 13.56 MHz, and the low deposition rates add much to the manufacturing cost.

It is thus an object of the present invention to provide a method of depositing a nanocomposite coating onto a solid metal or metal alloy substrate to increase the surface hardness of the substrate, in which the shortcomings associated with the conventional methods discussed above are mitigated, or at least to provide a useful alternative to the public.

It is also an object of the present invention to provide an article deposited with a nanocomposite coating, according to a method disclosed herein.

SUMMARY OF THE INVENTION

According to a first aspect of the present invention, there is provided a method of depositing a nanocomposite coating onto a metal or metal alloy substrate, including the steps of (a) providing at least one metal or metal alloy substrate; (b) depositing stainless steel on said at least one substrate; (c) depositing a carbide or nitride of a first metal on said at least one substrate; and (d) allowing a nanocomposite coating of said stainless steel and carbide or nitride of said first metal to form on said at least one substrate.

According to a second aspect of the present invention, there is provided a metal or metal alloy article deposited with a nanocomposite coating according to a method including the steps of (a) providing said metal or metal alloy article; (b) depositing stainless steel on said article; (c) depositing a metallic carbide or metallic nitride on said article; and (d) allowing a nanocomposite coating of said stainless steel and metallic carbide or metallic nitride to form on said article.

BRIEF DESCRIPTION OF THE DRAWINGS

Preferred embodiments of the present invention will now be discussed, by way of examples only, with reference to the accompanying drawings, in which.

DETAILED DESCRIPTION OF THE PREFERRED EMBODIMENT

A basic principle of a coating method according to the present invention is to deposit on a metal or metal alloy substrate, by physical vapor deposition, grains of stainless steel crystals along whose grain boundaries a nano-structure of molecules of metallic carbide or metallic nitride, e.g. chromium carbide or chromium nitride, is formed interstitially. This structure will prevent the grains of stainless steel from dislocating or sliding, to thereby achieve high surface hardness.

In this connection, however, an uncontrolled co-deposition of stainless steel and chromium carbide or chromium nitride will only yield a disorder mixture of stainless steel, chromium carbide, ferrous carbide and the like, with no enhancement in hardness of the treated stainless steel substrate. In addition, as chromium carbide is a ceramic and non-conductive, a radio-frequency (RF) power supply must be used. This is, however, incompatible with the direct current (DC) power supply required for deposition of stainless steel.

Therefore, a preferred embodiment of a method according to the present invention is based on reactive sputtering of chromium in a carbon-containing or nitrogen-containing gas plasma with prior, simultaneous or subsequent deposition of stainless steel. DC and low frequency, say 40 kHz, power supplies may be used, allowing process compatibility.

Figure 1A:
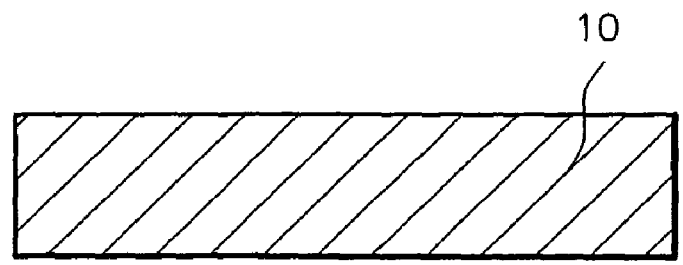
FIGS. 1A to 1C show schematically the steps whereby a stainless steel substrate is deposited with a nanocomposite coating according to a method according to a first embodiment of the present invention.
Figure 1B:
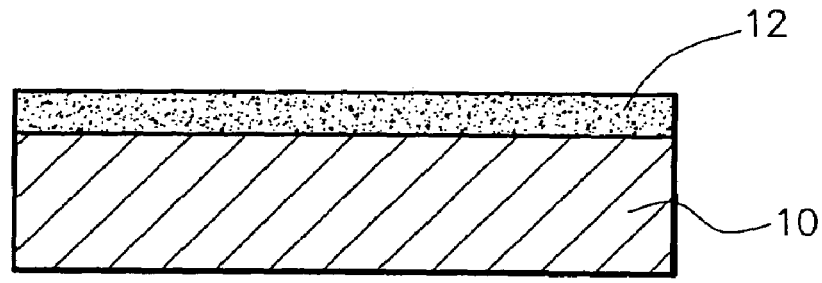
Figure 1C:
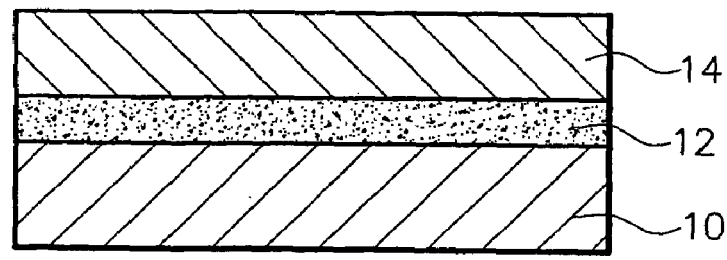

Referring firstly to FIGS. 1A to 1C, a stainless steel substrate 10 is provided. This stainless steel substrate 10 may be austenite or martensite stainless steel, with a hardness of 200 HV under the Vicker scale. For stress relief and enhancing the adhesion of the nanocomposite coating onto the stainless steel substrate 10, an interfacial layer 12 of titanium (Ti) is first deposited onto the substrate 10, as shown in FIG. 1B and in a manner to be discussed below. The interfacial layer 12 is of a thickness of 0.01 to 0.20 microns, and may alternatively be of zirconium (Zr), hafnium (Hf) or vanadium (V). A nanocomposite coating of stainless steel and chromium carbide 14, of a thickness of, e.g. 3 microns, is then deposited onto the interfacial layer 12, again in a manner to be discussed below.

Figure 2:
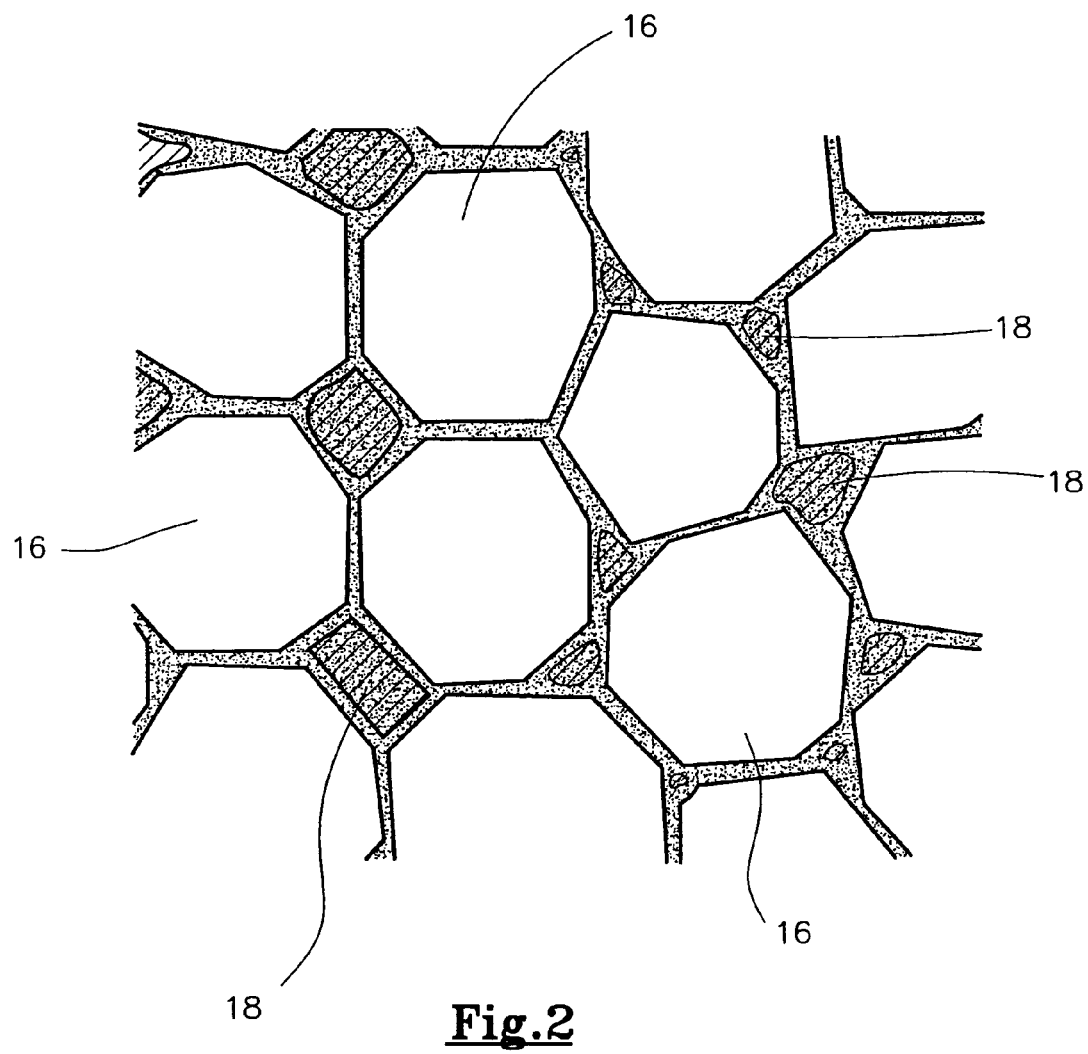
FIG. 2 shows schematically the nano-structure of the stainless steel substrate treated in accordance with the method shown in FIGS. 1A to 1C above.

FIG. 2 shows schematically the nano-structure of the nanocomposite coating of stainless steel and chromium carbide 14, including grains of stainless steel 16 interspersed with molecules of chromium carbide 18.

Figure 3A:
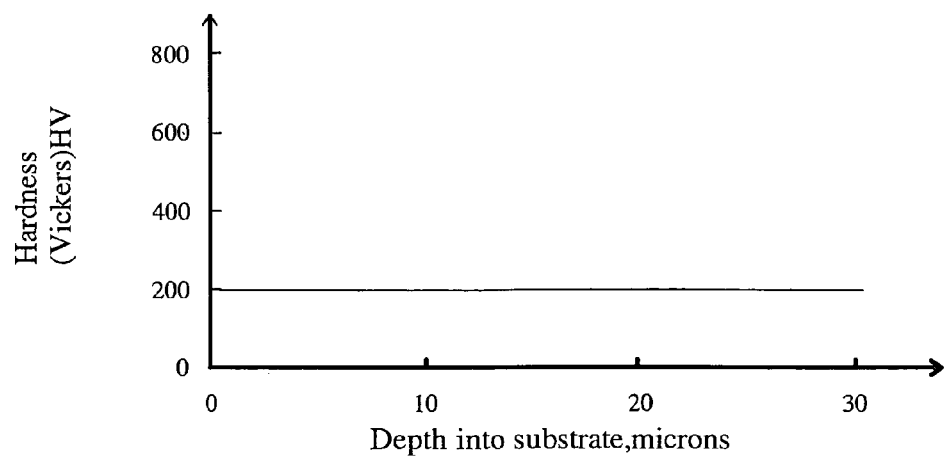
FIG. 3A is a diagram showing the hardness of the stainless steel substrate before deposition of the nanocomposite coating.
Figure 3B:
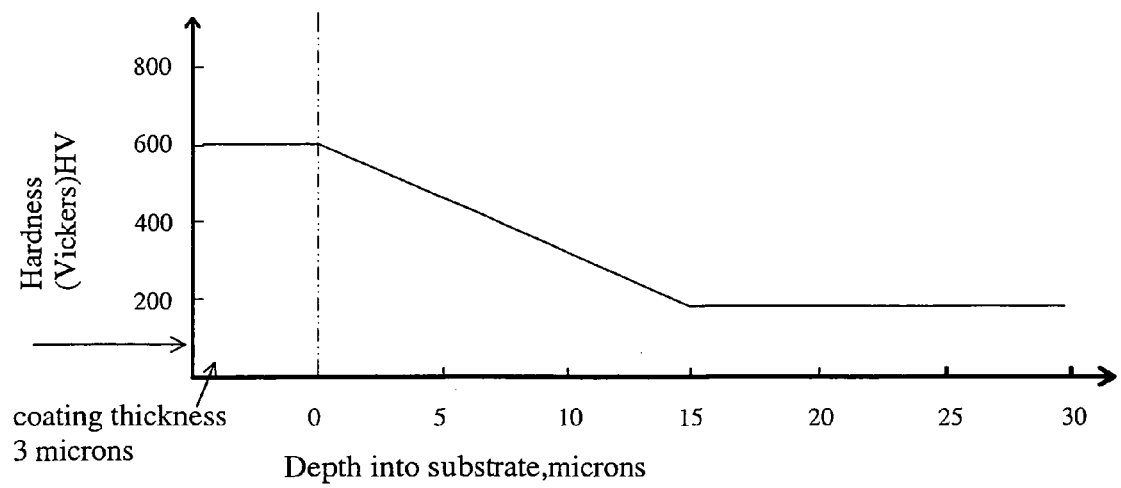
FIG. 3B is a diagram showing the hardness of the stainless steel substrate after deposition of the nanocomposite coating.

As shown in FIG. 3A, before deposition of the nanocomposite coating 14, the stainless steel substrate 10 is of a hardness of 200 HV all through. A very distinct feature of the present invention is that the enhancement of hardness does not stop abruptly at the interface of the stainless steel substrate 10 and the nanocomposite coating 14 of stainless steel and chromium carbide or chromium nitride. Because of the continuous penetration of both carbon/nitrogen and chromium atoms into the stainless steel substrate 10, a gradient concentration of chromium carbide or chromium nitride is also precipitated along the stainless steel grain boundaries of the substrate 10. The result is an even hardness in the nanocomposite coating, i.e. 600 HV for a 3-micron nanocomposite coating of stainless steel and chromium carbide as shown in FIG. 3B, and a gradient hardness in the stainless steel substrate 10. In the example shown in FIG. 3B, the hardness falls steadily and gradually from 600 HV at the interface (denoted by on the horizontal axis) of the stainless steel substrate 10 and the nanocomposite coating 14 to 200 HV at a depth of 15 microns into the substrate 10. The total hardness of the substrate 10 is thus further enhanced.

It is found in practice that the hardness of the nanocomposite coating is a function of its thickness, although values of the two are not in direct proportion to each other, i.e. they are not linearly related. In particular, if the nanocomposite coating of stainless steel and chromium carbide is of a thickness of 3 microns, the hardness will be around 600 HV, and a coating thickness of 4 microns will provide a hardness of 1,000–1,200 HV. Experiments showed that the coating so formed can be of a hardness of between 500 HV to 1,500 HV, measured under the Vicker scale.

Figure 4:
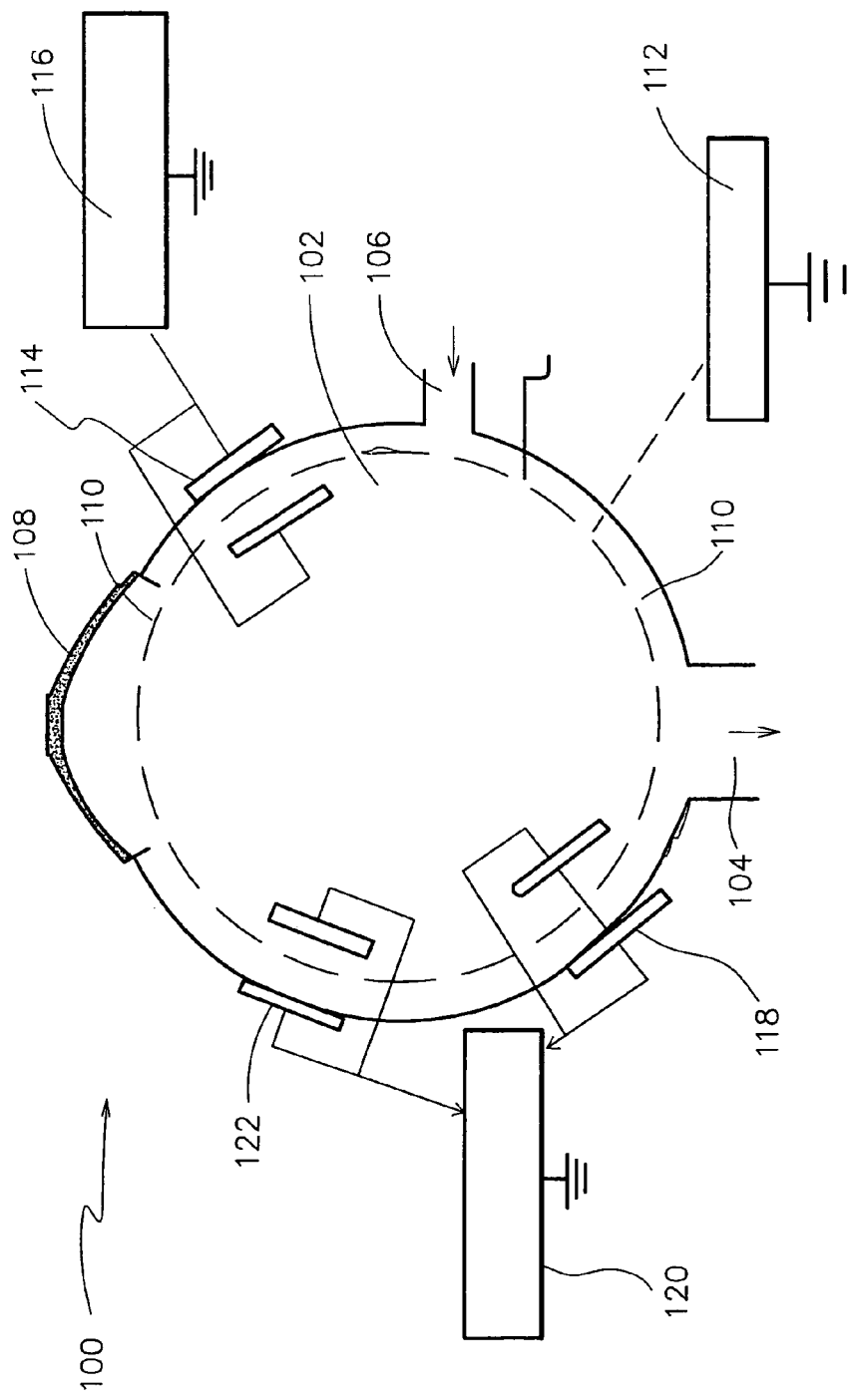
FIG. 4 is a schematic diagram showing an apparatus suitable for use in carrying out the deposition method according to the present invention.

FIG. 4 shows a schematic diagram of an ion-sputtering apparatus, generally designated as 100, suitable for working a method according to the present invention. The apparatus 100 includes a chamber 102 connectable via a first port 104 to a vacuum pump (not shown), and a second port 106 via which argon, a hydrocarbon gas, such as acetylene ($C_2H_2$) or methane ($CH_4$), or a nitrogen-containing gas, such as nitrogen ($N_2$) or ammonia ($NH_3$), may be introduced into the chamber 102. A door 108 is provided, allowing putting in of substrates 10 to be coated into the chamber 102, and removal of coated substrates 10 from the chamber 102.

Mounted in the chamber 102 for rotation are a number of electrically conductive carriers 110, to which the substrates 10 may be mounted for simultaneous rotation relative to the rest of the apparatus 100. A power supply 112 is connected to the carriers 110 for negatively biasing their electric potential, thus also negatively biasing the electrical potential of the substrates 10 mounted on the carriers 110. In this connection, continuous penetration (solid diffusion) of chromium atoms and carbon/nitrogen atoms into the stainless steel substrate 10 is enhanced by the electric field generated by negatively biasing the stainless steel substrate 10. This biasing voltage is preferably in the range of −20 volts to −200 volts.

A double-sided stainless steel target 114 connected to a 40 kHz power supply 116 is provided for supplying stainless steel for deposition onto the substrate 10. It is preferable that the stainless steel target 114 is the same as the to-be treated stainless steel substrate 10, for appearance matching purpose. A double-sided pure chromium target 118 connected to a switchable 40 kHz power supply 120 is provided for providing chromium for deposition purpose. Because there is an ample external source of chromium, there is no depletion of the chromium content in the stainless steel grains of the stainless steel substrate 10. No corrosion resistance of the stainless steel substrate 10 is thus compromised. Although the present invention has thus far been described in the context of deposition of nanocomposite coating of stainless steel and chromium carbide onto a stainless steel substrate, such other metallic carbides as tungsten carbide, tantalum carbide or titanium carbide, and such other metallic nitrides as chromium nitride, tungsten nitride, tantalum nitride or titanium nitride, may be used instead of chromium carbide, in which case the double-sided target 118 may be of tungsten (W), tantalum (Ta) or titanium (Ti). The switchable power source 120 is also connected to a double-sided pure titanium target 122, for providing a source of titanium for deposition onto the substrate 10 as the interfacial layer 12, as discussed above. In case such other metal as zirconium, hafnium or vanadium is to be used for deposition on the substrate 10 as the interfacial layer 12, as discussed above, the double-sided target 122 will be constituted of such other metal accordingly.

As discussed above, such a method can also be used for forming a nanocomposite coating of stainless steel and a metallic nitride onto a metal or metal alloy substrate. The hardness of such a nanocomposite coating can be improved by increasing its thickness. In the formation of such a nanocomposite coating, the source of nitrogen is a nitrogen-containing gas, e.g. nitrogen ($N_2$) or ammonia ($NH_3$). The process parameters for deposition of a nanocomposite coating of stainless steel and chromium nitride are similar to, but slightly different from, those for deposition of a nanocompositte coating of stainless steel and chromium carbide, with the difference mainly residing in the partial pressure of the nitrogen-containing gas.

Working examples of the present invention are given below.

EXAMPLE 1

Stainless steel watch bracelets were first de-waxed and thoroughly cleaned, and then placed on the carriers 110 of the ion-sputtering apparatus 100. After closing the door 108, the chamber 102 was pumped down to a base pressure of $2 \times 10^{-6}$ torr (i.e. mmHg; equivalent to around $2.666 \times 10^{-4}$ Pa). During pumping down, the chamber 102 was heated up to 300–350° C. When the required base pressure of $2 \times 10^{-6}$ mmHg (i.e. around $2.666 \times 10^4$ Pa) was reached, argon (Ar) gas was introduced into the chamber 102 and the pressure in the chamber 102 was raised to $5 \times 10^{-3}$ torr (i.e. around 0.667 Pa). A negative biasing voltage of 600–800 volts was applied to the watch bracelets, which initiated bombardment of argon atoms onto the watch bracelets, to thereby remove any residual contaminants from the surface of the watch bracelets.

The switchable power source 120 was then connected to the double-sided pure titanium target 122, whereby a thin layer (of a thickness of from 0.02 to 0.20 micron) of titanium was first deposited onto the watch bracelets. Only argon gas was used during deposition of the titanium interfacial layer and the total pressure was from $4 \times 10^{-3}$ torr to $6 \times 10^{-3}$ torr (i.e. from around 0.533 Pa to 0.800 Pa).

Subsequent to deposition of the interfacial layer of pure titanium on the watch bracelets, the total pressure in the chamber 102 was maintained at $4 \times 10^{-3}$ torr to $6 \times 10^{-3}$ torr (i.e. from around 0.533 Pa to 0.800 Pa), with the partial pressure of a hydrocarbon gas, e.g. methane ($CH_4$) or acetylene ($C_2H_2$), introduced into the chamber 102 at $1.5 \times 10^{-4}$ torr (i.e. around 0.020 Pa). The hydrocarbon gas provides the necessary carbon atoms for formation of chromium carbide molecules with the chromium atoms from the chromium target 118. The power density of the stainless steel target 114 was from 3 to 7 W/cm$^2$, and the power density of the chromium target 118 was from 6 to 9 W/cm$^2$. The carriers 110 were rotated at a speed of 3 to 8 revolutions per minute. For each revolution, a layer of stainless steel and chromium carbide of a thickness of between 5 to 10 nm was deposited on each of the watch bracelets. In particular, when the substrate 10 passes through the intense plasma regions enclosed by the opposing double-sided stainless steel target 114 and double-sided chromium target 118, very thin layers of stainless steel and chromium carbide will be deposited on the surface of the substrate 10. Thermodynamically, such deposited molecules are in an un-equilibrium state. A key feature of the present invention is that formation of nanocomposite structure/coating will happen when the substrates 10, e.g. watch bracelets, are away from the sputtering targets 114, 118. At such time, the stainless steel and chromium carbide molecules settled into the most thermodynamically suitable sites, i.e. the local sites in which they possessed the lowest possible entropy, and the chromium carbide molecules precipitated along the grain boundaries of the stainless steel. A continuous deposition process will, on the other hand, not achieve nanocomposite structure, and the coating will only be a random mixture of stainless steel and chromium carbide molecules, with no hardness-enhancement effect.

The process time is a function of the thickness requirement, which is also dependent on the hardness requirement. For a rotation rate of 4 revolutions per minute and a deposition rate of 7.5 nm per revolution, a 3-micron coating (affording a hardness of around 600 HV) required a process time of about 100 minutes.

It can be seen that the present process is a clean process, as no post-deposition treatment, e.g. polishing, is required.

EXAMPLE 2

Instead of using pure stainless steel and chromium targets, as discussed in Example 1 above, alloy targets of stainless steel and chromium were used. The alloy targets contained 40–60 wt. % of stainless steel, with the rest being chromium. The process was very similar to that discussed in Example 1 above, except that stainless steel and chromium particles were co-sputtered reactively in a carbon gas plasma, forming adjacent molecules of stainless steel and chromium carbide. Again, when the stainless steel articles, which were watch cases in the present Example, were away from the deposition locations, the stainless steel and chromium carbide molecules relaxed into their most thermodynamically suitable sites, thus forming the nanocomposite structure of hard stainless steel and chromium carbide coating.

EXAMPLE 3

Stainless steel watch casings were first de-waxed and thoroughly cleaned, and then placed on the carriers 110 of the ion-sputtering apparatus 100. After closing the door 108, the chamber 102 was pumped down to a base pressure of $2\times10^{-6}$ torr (around $2.666\times10^{-4}$ Pa). During pumping down, the chamber 102 was heated up to 300–350° C. When the required base pressure of $2\times10^{-6}$ mmHg (i.e. around $2.666\times10^{-4}$ Pa) was reached, argon (Ar) gas was introduced into the chamber 102 and the pressure in the chamber 102 was raised to $5\times10^{-3}$ torr (i.e. around 0.667 Pa). A negative biasing voltage of 600–800 volts was applied to the watch casings, which initiated bombardment of argon atoms onto the watch casings, to thereby remove any residual contaminants from the surface of the watch casings.

The switchable power source 120 was then connected to the double-sided pure titanium target 122, whereby a thin layer (of a thickness of from 0.02 to 0.20 micron) of titanium was first deposited onto the watch casings. Only argon gas was used during deposition of the titanium interfacial layer and the total pressure was from $4\times10^{-3}$ torr to $6\times10^{-3}$ torr (i.e. from around 0.533 Pa to 0.800 Pa).

Subsequent to deposition of the interfacial layer of pure titanium on the watch casings, the total pressure in the chamber 102 was maintained to $4\times10^{-3}$ torr to $6\times10^{-3}$ torr (i.e. from around 0.533 Pa to 0.800 Pa), with the partial pressure of a nitrogen-containing gas, e.g. nitrogen ($N_2$) or ammonia ($NH_3$), introduced into the chamber 102 at $3.0\times10^{-4}$ torr (i.e. around 0.040 Pa). Such a gas provides the necessary nitrogen atoms for formation of chromium nitride molecules with the chromium atoms from the chromium target 118. The power density of the stainless steel target 114 was from 3 to 7 W/cm$^2$, and the power density of the chromium target 118 was from 6 to 9 W/cm$^2$. The carriers 110 were rotated at a speed of 3 to 8 revolutions per minute. For each revolution, a layer of stainless steel and chromium nitride of a thickness of between 5 to 10 nm was deposited on each of the watch casings. In particular, when the substrate 10 passes through the intense plasma regions enclosed by the opposing double-sided stainless steel target 114 and double-sided chromium target 118, very thin layers of stainless steel and chromium nitride will be deposited on the surface of the substrate 10. Thermodynamically, such deposited molecules are in an un-equilibrium state. A key feature of the present invention is that formation of nano-composite structure/coating will happen when the substrates 10, e.g. watch casings, are away from the sputtering targets 114, 118. At such time, the stainless steel and chromium nitride molecules settled into the most thermodynamically suitable sites, i.e. the local sites in which they possessed the lowest possible entropy, and the chromium nitride molecules precipitated along the grain boundaries of the stainless steel. A continuous deposition process will, on the other hand, not achieve nanocomposite structure, and the coating will only be a random mixture of stainless steel and chromium nitride molecules, with no hardness-enhancement effect.

Although the above invention has thus far been discussed in the context of a stainless steel substrate, it has been found in practice that such a method can be practiced on various solid metal or metal alloy substrates, including copper, copper alloys, aluminum, aluminum alloys, magnesium, magnesium alloys, titanium, and titanium alloys. The metallic material with which the substrate is made is irrelevant in so far as the deposition and formation of nanocomposite coatings of stainless steel and metallic carbide/nitride are concerned, since the constituent stainless steel, chromium, tungsten, tantalum, titanium, carbon-containing gas or nitrogen-containing gas are not extracted from the substrate material, but are externally supplied. Although soft substrates, such as copper alloys, aluminum alloys and magnesium, coated with such a nanocomposite coating is softer than titanium alloys and stainless steel coated with such a nanocomposite coating, soft substrates deposited with a nanocomposite coating in accordance with the present invention can still provide a relatively hard and wear-resisting coating which is corrosion-resisting and of a stainless-steel-like appearance.

It should be understood that the above only illustrates examples whereby the present invention may be carried out, and that various modifications and/or alterations may be made thereto without departing from the spirit of the invention. In particular, although the present invention has here been described as being carried out by reactive sputtering, a person skilled in the art would appreciate that such can be achieved by employing other vapor deposition techniques, such as multi-arc reactive deposition, or reactive evaporation ion-plating.

It should also be understood that certain features of the invention, which are, for clarity, described in the context of separate embodiments, may be provided in combination in a single embodiment. Conversely, various features of the invention which are, for brevity, described in the context of a single embodiment, may also be provided separately or in any appropriate sub-combinations.

What is claimed is:

1. A method of depositing a nanocomposite coating onto a metal or substrate, including the steps of:
   (a) providing at least one metal or metal alloy substrate;
   (b) depositing stainless steel on said at least one substrate;
   (c) depositing a carbide or nitride of a first metal on said at least one substrate; and
   (d) allowing a nanocomposite coating of said stainless steel and carbide or nitride of said first metal to form on said at least one substrate, wherein the nanocomposite coating includes grains of stainless steel crystals along whose grain boundaries a nano-structure of molecules of metallic carbide or metallic nitride is formed interstitially, and wherein said substrate is made at least principally of stainless steel, copper, aluminum, magnesium, titanium, or an alloy of any of these metals.

2. A method according to claim 1 wherein said substrate is of substantially the same hardness as the stainless steel to be deposited on said substrate.

3. A method according to claim 1 wherein said first metal is chromium, tungsten, tantalum, or titanium.

4. A method according to claim 1 further including the step of providing a source of stainless steel for deposition on said at least one substrate.

5. A method according to claim 1 further including the step of providing a source of said first metal.

6. A method of depositing a nanocomposite coating onto a metal or metal alloy substrate including the steps of:
   (a) providing at least one metal or metal alloy substrate;
   (b) depositing stainless steel on said at least one substrate;
   (c) depositing a carbide or nitride of a first metal on said at least one substrate; and
   (d) allowing a nanocomposite coating of said stainless steel and carbide or nitride of said first metal to form on said at least one substrate, wherein the nanocomposite coating includes grains of stainless steel crystals along whose grain boundaries a nano-structure of molecules of metallic carbide or metallic nitride is formed insterstitially, further including the step of providing a source of both said first metal and said stainless steel for deposition on said at least one substrate, wherein said source of both said first metal and said stainless steel for deposition on said substrate is an alloy of stainless steel and said first metal, and further including the step of reactively co-sputtering stainless steel and atoms of said first metal.

7. A method of depositing a nanocomposite coating onto a metal or metal alloy substrate, including the steps of:
   (a) providing at least one metal or metal alloy substrate;
   (b) depositing stainless steel on said at least one substrate;
   (c) depositing a carbide or nitride of a first metal on said at least one substrate; and
   (d) allowing a nanocomposite coating of said stainless steel and carbide or nitride of said first metal to form on said at least one substrate, wherein the nanocomposite coating includes grains of stainless steel crystals alone whose grain boundaries a nano-structure of molecules of metallic carbide or metallic nitride is formed interstitially, further including the step of forming a layer of a second metal between said substrate and said nanocomposite coating.

8. A method according to claim 7 wherein said second metal is titanium, zirconium, hafnium or vanadium.

9. A method according to claim 7 wherein said layer of second metal is of a thickness of substantially 0.01 to 0.20 microns.

10. A method of depositing a nanocomposite coating onto a metal or metal alloy substrate, including the steps of:
    (a) providing at least one metal or metal alloy substrate:
    (b) depositing stainless steel on said at least one substrate;
    (c) depositing a carbide or nitride of a first metal on said at least one substrate; and
    (d) allowing a nanocomposite coating of said stainless steel and carbide or nitride of said first metal to form on said at least one substrate, wherein the nanocomposite coating includes grains of stainless steel crystals alone whose grain boundaries a nano-structure of molecules of metallic carbide or metallic nitride is formed interstitially, further including the step of providing a source of carbon, wherein said source of carbon is a hydrocarbon gas.

11. A method according to claim 10 wherein said hydrocarbon gas is methane or acetylene.

12. A method of depositing a nanocomposite coating onto a metal alloy substrate, including the steps of:
    (a) providing at least one metal or metal alloy substrate:
    (b) depositing stainless steel on said at least one substrate;
    (c) depositing a carbide or nitride of a first metal on said at least one substrate; and
    (d) allowing a nanocomposite coating of said stainless steel and carbide or nitride of said first metal to form on said at least one substrate, wherein the nanocomposite coating includes grains of stainless steel crystals along whose grain boundaries a nano-structure of molecules of metallic carbide or metallic nitride is formed interstitially, further including the step of providing a source of nitrogen.

13. A method according to claim 12 wherein said source of nitrogen is nitrogen gas or ammonia.

14. A method of depositing a nanocomposite coating onto a metal or metal alloy substrate, including the steps of:
    (a) providing at least one metal or metal alloy substrate:
    (b) depositing stainless steel on said at least one substrate;
    (c) depositing a carbide or nitride of a first metal on said at least one substrate; and
    (d) allowing a nanocomposite coating of said stainless steel and carbide or nitride of said first metal to form on said at least one substrate, wherein the nanocomposite coating includes grains of stainless steel crystals alone whose grain boundaries a nano-structure of molecules of metallic carbide or metallic nitride is formed interstitially, further including the step of negatively biasing said at least one substrate during deposition of stainless steel and said carbide or nitride of said first metal.

15. A method according to claim 14 wherein the biasing voltage is between of −20 volts to −200 volts.

16. A method of depositing a nanocomposite coating onto a metal or metal alloy substrate, including the steps of:
    (a) providing at least one metal or metal alloy substrate:
    (b) depositing stainless steel on said at least one substrate;
    (c) depositing a carbide or nitride of a first metal on said at least one substrate; and
    (d) allowing a nanocomposite coating of said stainless steel and carbide or nitride of said first metal to form on said at least one substrate, wherein the nanocomposite coating includes grains of stainless steel crystals along whose grain boundaries a nano-structure of molecules of metallic carbide or metallic nitride is formed interstitially, further including the steps of:
    (e) placing said at least one substrate at a first location for deposition of stainless steel thereon;
    (f) placing said at least one substrate at a second location for deposition of said carbide or nitride of said first metal thereon; and
    (g) moving said at least one substrate away from said first and second locations to allow a nanocomposite coating of said stainless steel and said carbide or nitride of said first metal to form on said at least one substrate.

17. A method according to claim 16 further including the step of placing said at least one substrate at a third location for deposition of a second metal thereon before placing said at least one substrate at said first location and said second location.

18. A metal or metal alloy article deposited with a nanocomposite coating according to the method of claim 1.

19. A method of forming a coating onto a metal or substrate, including the steps of:
    (a) providing at least one metal or metal alloy substrate; and
    (b) vapor depositing stainless steel and a carbide or nitride of a first metal on said at least one metal or metal alloy substrate to form grains of stainless steel interspersed with molecules of the carbide or nitride of the first metal along the grain boundaries of the stainless steel on said at least one metal or metal alloy substrate.

20. A method according to claim 19, further including the step of forming a layer of a titanium, zirconium, hafnium or vanadium between said substrate and said coating, wherein optionally said layer of second metal is of a thickness of substantially 0.01 to 0.20 microns.

21. A method according to claim 19, further including the step of providing a hydrocarbon gas, nitrogen gas or ammonia, and/or further including the step of negatively biasing said at least one substrate during deposition of stainless steel and said carbide or nitride of said first metal.

* * * * *